United States Patent
Xie et al.

(10) Patent No.: US 9,460,959 B1
(45) Date of Patent: Oct. 4, 2016

(54) METHODS FOR PRE-CLEANING CONDUCTIVE INTERCONNECT STRUCTURES

(71) Applicant: APPLIED MATERIALS, INC., Santa Clara, CA (US)

(72) Inventors: Xiangjin Xie, Fremont, CA (US); Feng Q. Liu, San Jose, CA (US); Daping Yao, Portland, OR (US); Alexander Jansen, Sunnyvale, CA (US); Joung Joo Lee, San Jose, CA (US); Adolph Miller Allen, Oakland, CA (US); Xianmin Tang, San Jose, CA (US); Mei Chang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/958,459

(22) Filed: Dec. 3, 2015

Related U.S. Application Data

(60) Provisional application No. 62/236,470, filed on Oct. 2, 2015.

(51) Int. Cl.
| | |
|---|---|
| *B08B 6/00* | (2006.01) |
| *H01L 21/768* | (2006.01) |
| *B08B 7/00* | (2006.01) |
| *B08B 3/00* | (2006.01) |
| *B08B 5/00* | (2006.01) |
| *B08B 9/00* | (2006.01) |
| *B08B 9/027* | (2006.01) |

(52) U.S. Cl.
CPC ....... *H01L 21/76814* (2013.01); *B08B 7/0035* (2013.01); *B08B 7/0071* (2013.01); *B08B 3/00* (2013.01); *B08B 5/00* (2013.01); *B08B 9/00* (2013.01); *B08B 9/027* (2013.01)

(58) Field of Classification Search
CPC ..... B08B 3/00; B08B 7/0035; B08B 7/0071; B08B 5/00; B08B 9/00; B08B 9/027; H01L 21/76814
See application file for complete search history.

(56) References Cited

U.S. PATENT DOCUMENTS

| | | | | |
|---|---|---|---|---|
| 6,030,754 A | * | 2/2000 | Atnip | G03F 7/427 134/1.2 |
| 6,232,239 B1 | * | 5/2001 | Lim | H01L 21/02063 257/E21.228 |
| 6,399,552 B1 | * | 6/2002 | Lee | C11D 7/06 134/3 |
| 8,633,117 B1 | * | 1/2014 | Cabral | H01L 27/092 438/710 |
| 2003/0181041 A1 | * | 9/2003 | Ikegami | H01L 21/76838 438/687 |
| 2005/0241672 A1 | * | 11/2005 | Matz | B08B 7/0021 134/1.2 |
| 2006/0063308 A1 | * | 3/2006 | Shim | C11D 7/08 438/115 |
| 2006/0180572 A1 | * | 8/2006 | Jacobson | B08B 7/0021 216/83 |
| 2007/0037389 A1 | | 2/2007 | Chen et al. | |
| 2008/0044990 A1 | * | 2/2008 | Lee | C23G 1/103 438/586 |

* cited by examiner

*Primary Examiner* — Bibi Carrillo
(74) *Attorney, Agent, or Firm* — Moser Taboada; Alan Taboada

(57) ABSTRACT

Methods for processing a substrate are provided herein. In some embodiments, method of processing a substrate includes: heating a substrate disposed within a processing volume of a substrate processing chamber to a temperature of up to about 400 degrees Celsius, wherein the substrate comprises a first surface, an opposing second surface, and an opening formed in the first surface and extending towards the opposing second surface, and wherein the second surface comprises a conductive material disposed in the second surface and aligned with the opening; and exposing the substrate to a process gas comprising about 80 to about 100 wt % of an alcohol to reduce a contaminated surface of the conductive material.

18 Claims, 5 Drawing Sheets

METHODS FOR PRE-CLEANING CONDUCTIVE INTERCONNECT STRUCTURES

CROSS-REFERENCE TO RELATED APPLICATIONS

This application claims benefit of U.S. provisional patent application Ser. No. 62/236,470, filed Oct. 2, 2015, which is herein incorporated by reference in its entirety.

FIELD

Embodiments of the present disclosure generally relate to methods of processing a substrate, specifically method of pre-cleaning a conductive interconnect structure.

BACKGROUND

In the fabrication of integrated circuit (IC) interconnect structures, conductive surfaces, such as copper surfaces or cobalt surfaces, formed at the bottom of a via are typically contaminated with etching byproducts and residues formed during via opening and subsequent metal hard mask removal. While large sized particles may be removed by a subsequent dry clean process, the atomic level contamination from etching related elements such as oxygen, fluorine, and carbon or from oxidation due to air exposure on the conductive interconnect surface cannot be removed by a dry clean process.

Typically, the fluorine, oxygen, and carbon contamination can be removed through wet clean methods. However, the inventors have observed that these techniques are not useful for newer back end of the line (BEOL) processes due to compatibility issues with low-k dielectrics as well as recent tighter requirements on low-k damage (e.g., carbon depletion issues). A thermal or mild dry clean is typically used for post via etching to improve electrical performance through a more gentle process.

Accordingly, the inventors have developed improved techniques to reduce the conductive interconnect surface.

SUMMARY

Methods for processing a substrate are provided herein. In some embodiments, a method of processing a substrate includes: heating a substrate disposed within a processing volume of a substrate processing chamber to a temperature of up to about 400 degrees Celsius, wherein the substrate comprises a first surface, an opposing second surface, and an opening formed in the first surface and extending towards the opposing second surface, and wherein the second surface comprises a conductive material disposed in the second surface and aligned with the opening; and exposing the substrate to a process gas comprising about 80 to about 100 wt % of an alcohol to reduce a contaminated surface of the conductive material.

In some embodiments, a method of processing a substrate includes: heating a substrate disposed in a processing volume of a substrate processing chamber to a temperature of up to about 400 degrees Celsius, wherein the substrate comprises a first surface and an opening formed in the first surface and extending towards an opposing second surface having a copper material disposed in the second surface and aligned with the opening; and exposing the substrate to about 80 to about 100 wt % of an alcohol to reduce a contaminated surface of the copper material, wherein the alcohol has a formula $C_nH_{2n+1}$—OH, and wherein n is a whole number.

In some embodiments, a computer readable medium is provided having instructions stored thereon that, when executed, causes a process chamber to perform a method for processing a substrate. The method may include any of the methods disclosed herein Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
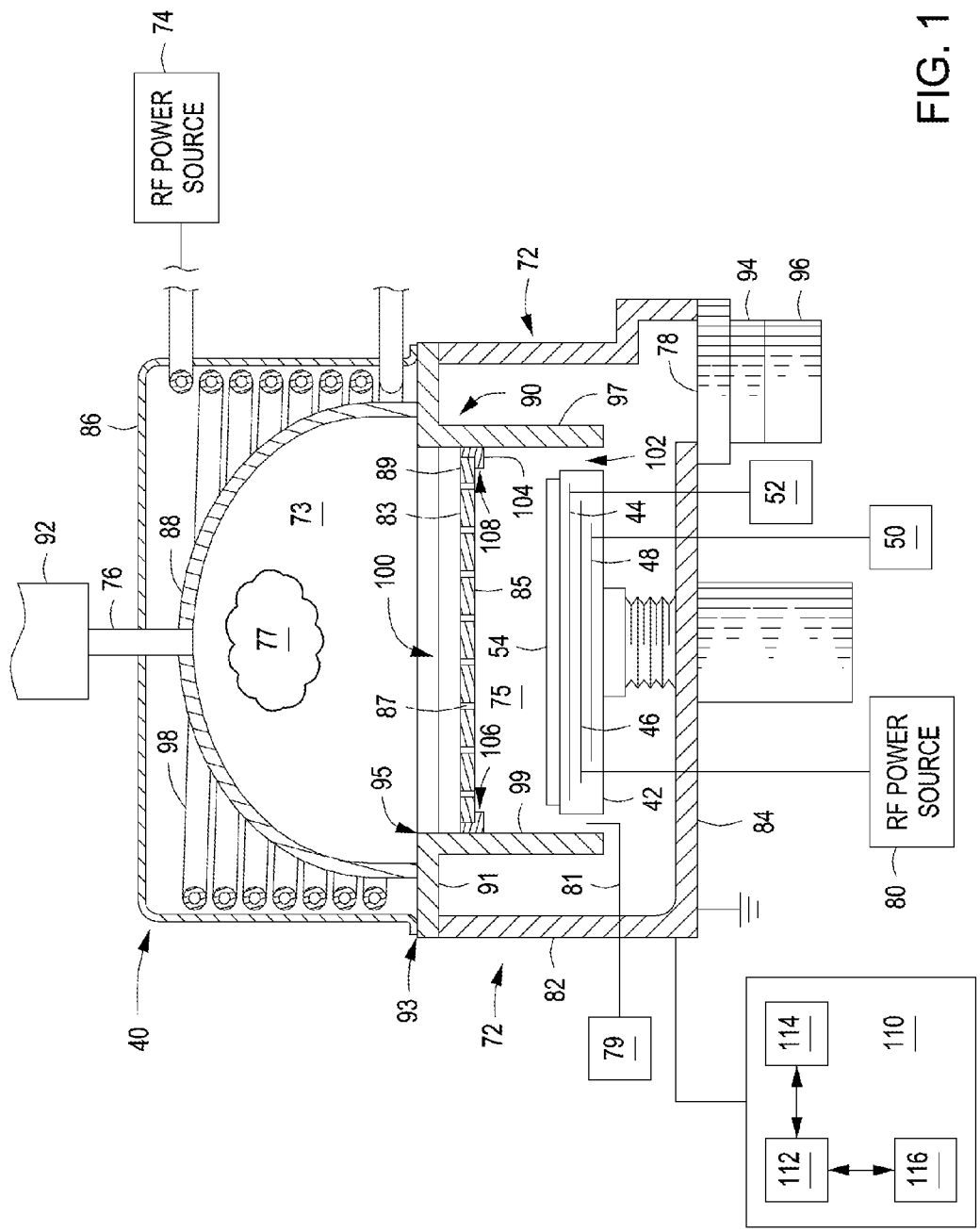
FIG. 1 depicts schematic view of a substrate processing system in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for processing a substrate are provided herein. The inventive methods advantageously facilitate reducing the conductive interconnect surface while maintaining low-k integrity, electrical conductivity and reliability for IC interconnect structures. As used in the current disclosure, the terms "reduce", "reducing", or "reduction" refers to the partial or complete removal of oxygen, via chemical reaction, from a surface (e.g. a contaminated surface 224 described below). The inventive methods may be utilized in the formation of metal interconnects in an integrated circuit, or in the formation of a metal gate or a metal-contact gap fill process, as well as other suitable applications where metal reduction may be performed.

Figure 4:
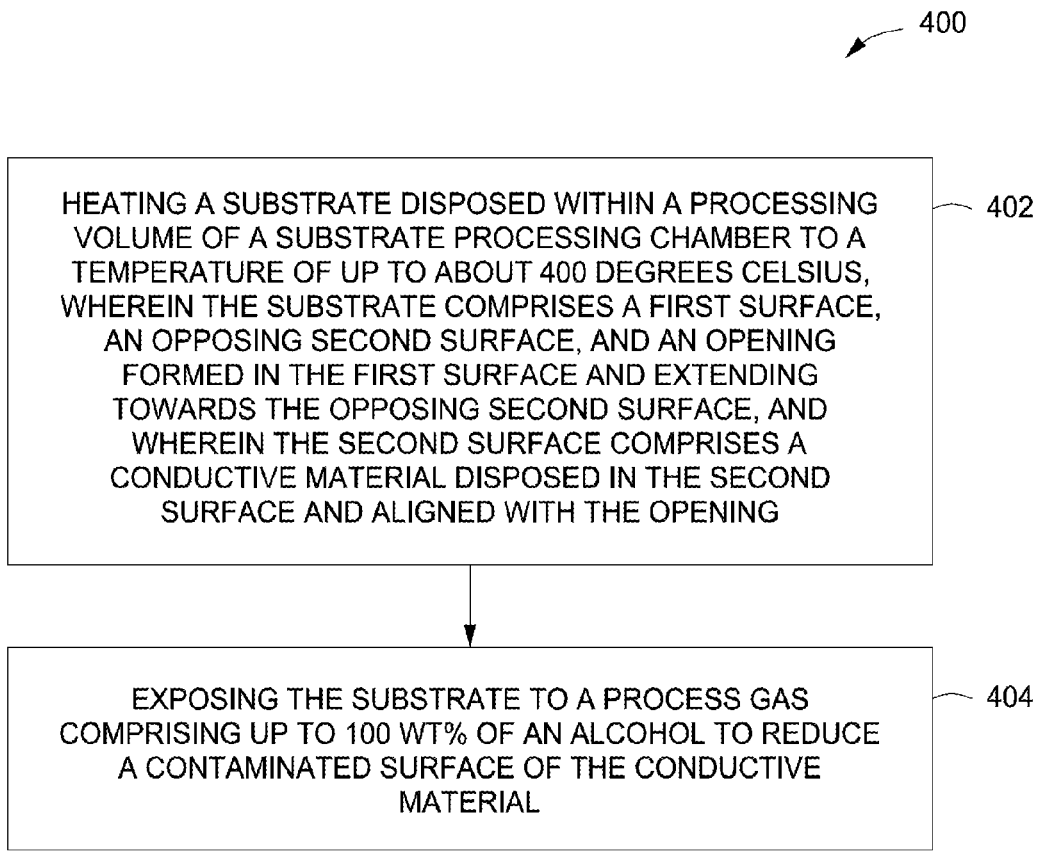
FIG. 4 depicts a flow chart of a method for processing a substrate in accordance with some embodiments of the present disclosure.

FIG. 4 depicts a flow chart of a method 400 for processing a substrate in accordance with some embodiments of the present disclosure. The method 400 is described below with respect to the stages of processing a substrate as depicted in FIGS. 2A-2F and may be performed, for example, in a suitable reactor, such as is described below with respect to FIG. 4. Exemplary processing systems that may be used to perform the inventive methods disclosed herein may include, but are not limited to, any of the ENDURA®, CENTURA®, or PRODUCER® line of processing systems, commercially available from Applied Materials, Inc., of Santa Clara, Calif. Other process chambers, including ones available from other manufacturers, may also be suitably used in connection with the teachings provided herein.

Figure 2A:
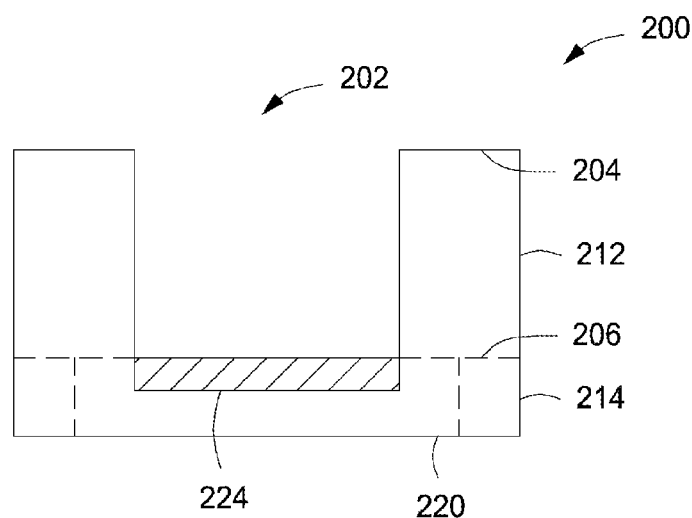
FIGS. 2A-F depict the stages of processing a substrate in accordance with some embodiments of the present disclosure.

The method 400 may be performed on a substrate 200, as depicted in FIG. 2A, having an opening 202 formed in a first surface 204 of the substrate 200 and extending into the substrate 200 towards an opposing second surface 206 of the substrate 200. The substrate 200 may be any suitable substrate having an opening 202 formed in the substrate 200. For example, the substrate 200 may comprise one or more of a dielectric material, silicon (Si), metals, or the like. In addition, the substrate 200 may include additional layers of materials or may have one or more completed or partially completed structures formed in, or on, the substrate 200. For example, the substrate 200 may include a first dielectric layer 212, such as silicon oxide, a low-k material (e.g., a material having a dielectric constant less than silicon oxide, or less than about 3.9), or the like. The opening 202 may be formed in the first dielectric layer 212. In some embodiments, the first dielectric layer 212 may be disposed atop a second dielectric layer 214, such as silicon oxide, silicon nitride, silicon carbide, or the like. A conductive material (e.g., conductive material 220), such as copper or cobalt, may be disposed in the second dielectric layer 214 and may be aligned with the opening 202 such that the opening, when filled with a conductive material, provides an electrical path to and from the conductive material. For example, the conductive material may be part of a line or via to which the interconnect is coupled.

The opening 202 may be any opening, such as a via, trench, dual damascene structure, or the like. In some embodiments, the opening 202 may have a height to width aspect ratio of about 4:1 or more (e.g., a high aspect ratio). The opening 202 may be formed by etching the substrate 200 using any suitable etch process. As result of forming the opening 202, the conductive material 220 forms a contaminated surface 224. The contaminated surface 224 comprises an oxidized surface. For example, in embodiments where the conductive material 220 is copper or cobalt, the contaminated surface 224 is copper oxide (CuO) or cobalt oxide (CoO) respectively.

In some embodiments, the opening 202 can be formed by forming a patterned mask layer over the first dielectric layer 212 to etch the opening 202 into the first dielectric layer 212 to the surface (e.g., a top surface) of the conductive material 220. The patterned mask layer may be any suitable mask layer such as a hard mask or photoresist layer. The patterned mask layer may be formed by any process suitable to form a patterned mask layer capable of providing an adequate template for defining a pattern in the underlying first dielectric layer 212. For example, in some embodiments, the patterned mask layer may be formed via a patterned etch process. In some embodiments, the opening 202 may be a trench or a via. The opening 202 may be etched via any etching process suitable for etching a dielectric material to form an opening 202 having vertical or substantially vertical sidewalls. For example, the substrate 200 may be exposed to an etching plasma formed using a halogen containing gas, for example a fluorine-containing gas such as carbon tetrafluoride (CEO, methyl trifluoride (CHF$_3$), octafluorocyclobutane (C$_4$F$_8$), hexafluorobutadiene (C$_4$F$_6$), nitrogen trifluoride (NF$_3$), sulfur hexafluoride (SF$_6$), or the like.

The method 400 begins at 402 by heating the substrate 200 to a temperature of up to about 400 degrees Celsius. In some embodiments, the substrate 200 is heated to a temperature of about 250 to about 350 degrees Celsius. The inventors have observed that heating the substrate 200 to a temperature of up to about 400 degrees Celsius, for example about 250 to about 350 degrees Celsius, provides the activation energy for the process gas described below to react with the contaminated surface 224. In addition, heating the substrate 200 to the temperature described above prevents build-up of organic residue and formation of water condensation on the substrate 200. The substrate 200 may be heated using any suitable heating mechanism, such as a substrate heater embedded within a substrate support pedestal.

Figure 2B:
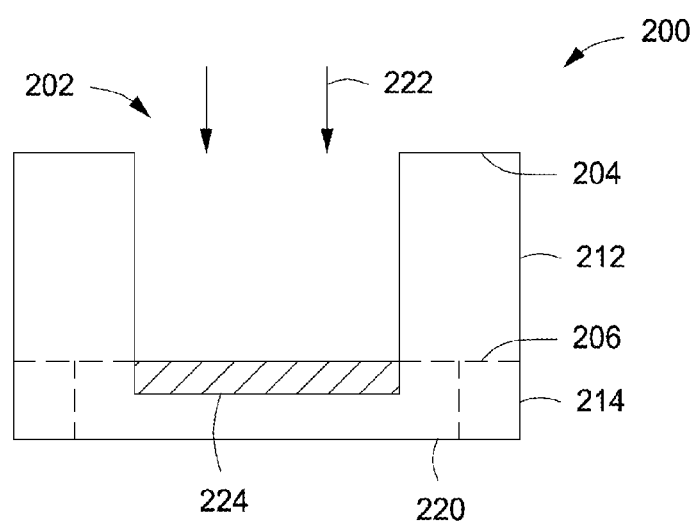

Next at 404, and as depicted in FIG. 2B, the substrate 200 is exposed to a process gas 222 comprising up to 100 wt % of an alcohol. In some embodiments, the process gas 222 comprises about 80 to about 100 wt % of an alcohol, such as about 95 wt %. In some embodiments, the process gas 222 consists or consists essentially of about 100 wt % of an alcohol. In some embodiments, the process gas 222 consists of, or consists essentially of, an alcohol and, optionally, hydrogen radicals or a mixture of hydrogen radicals and one or more noble gases. For example, in some embodiments, the process gas 222 consists of, or consists essentially of, an alcohol, in any of the above disclosed percentages, with the balance of the process gas being hydrogen radicals or a mixture of hydrogen radicals and one or more noble gas elements.

For example, in some embodiments, 100 wt % of an alcohol is provided to the processing volume to interact with the substrate 200. The substrate 200 may thus be exposed to the 100 wt % of the alcohol. In some embodiments, hydrogen radicals or a mixture of hydrogen radicals and one or more noble gas elements (e.g., mixture of hydrogen radicals) may be provided to the processing volume and can mix with the 100 wt % of the alcohol. In some embodiments, the hydrogen radicals or mixture of hydrogen radicals can be provided to the processing volume prior to exposing the substrate to the 100 wt % of the alcohol. In some embodiments, the hydrogen radicals or mixture of hydrogen radicals can be provided to the processing volume concurrently with the 100 wt % of the alcohol such that the substrate is exposed to both of the 100 wt % of the alcohol and the hydrogen radicals or mixture of hydrogen radicals.

In some embodiments, the alcohol comprises an organic compound having a hydroxyl (OH) functional group. In some embodiments, the alcohol has the formula $C_nH_{2n+1}$—OH, where n is a whole number. In some embodiments, the alcohol is one or more of methanol (CH$_3$OH), ethanol (C$_2$H$_5$OH), isopropanol (C$_3$H$_7$OH), or butanol (C$_4$H$_9$OH).

The vaporized alcohol reacts with the contaminated surface 224 to produce volatile byproducts that can be pumped out of the processing chamber. For example, the reaction of vaporized ethanol with a contaminated surface 224 of copper oxide proceeds via the reaction shown below to form volatile byproducts of carbon dioxide (CO$_2$), aldehyde, and water vapor (H$_2$O) which can be evacuated from the process chamber leaving an uncontaminated surface of the conductive material 220.

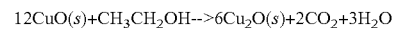
$$12CuO(s)+CH_3CH_2OH \rightarrow 6Cu_2O(s)+2CO_2+3H_2O \qquad [1]$$

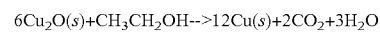
$$6Cu_2O(s)+CH_3CH_2OH \rightarrow 12Cu(s)+2CO_2+3H_2O \qquad [2]$$

Figure 2C:
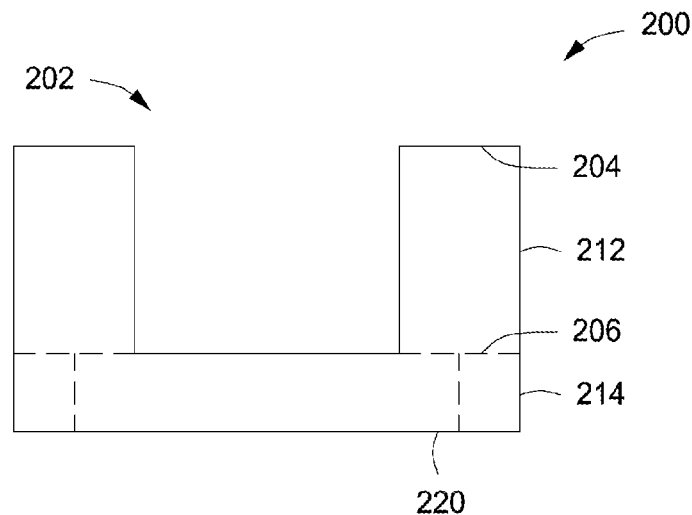

As depicted in FIG. 2C, exposing the substrate 200 to a process gas 222 comprising up to 100 wt % of an alcohol, such as ethanol, at substrate temperature described above advantageously reduces the contaminated surface 224 formed atop the conductive material 220 while maintaining low k integrity, electrical conductivity and reliability for IC interconnect structures. In addition, the alcohol treatment helps to restore damaged hydrophilic low-k surfaces to a hydrophobic state and reduces or prevents carbon depletion from low-k surfaces. For example, the inventors have observed that the method 400 can advantageously greatly reduce or completely eliminate carbon depletion from low-k surfaces.

In some embodiments, liquid alcohol is stored in an ampoule coupled to the process chamber. The ampoule is heated to a predetermined temperature, for example about 20 to about 50 degrees Celsius, to vaporize the alcohol. The vaporized alcohol is provided to the processing volume of the process chamber via a vacuum draw process. The vacuum draw process advantageously allows the introduction of a high concentration of vaporized alcohol (e.g. up to 100 wt % alcohol) into the processing volume of the process chamber without diluting the process gas with a carrier flow gas or utilize a mechanical flow mechanism. General processing conditions for the processing volume of the process chamber during exposure to the process gas includes a pressure in the process chamber of about 0.1 to about 30 Torr, or in some embodiments about 0.6 to about 3 Torr.

The inventors have observed that exposure to the concentrated process gas and the pressure and temperature ranges utilized in the method 400 above advantageously reduce the exposure time to reduce the contaminated surface 224 from the conductive material 220. For example, at the concentrations, pressure and temperature ranges provided above, exposure to the process gas for up to about 120 seconds, or for about 30 to about 120 seconds, or up to about 60 seconds is sufficient to reduce the contaminated surface 224. In addition, the temperature and pressure ranges described above advantageously improve outgassing of volatile by-products from the reduction process.

Figure 2D:
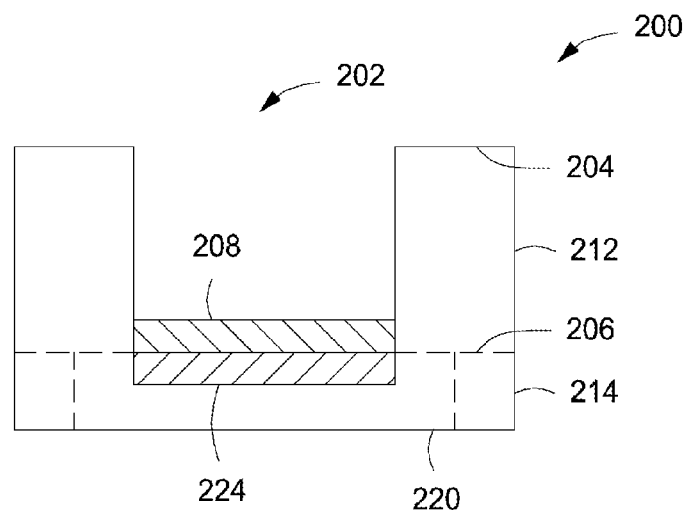
Figure 2E:
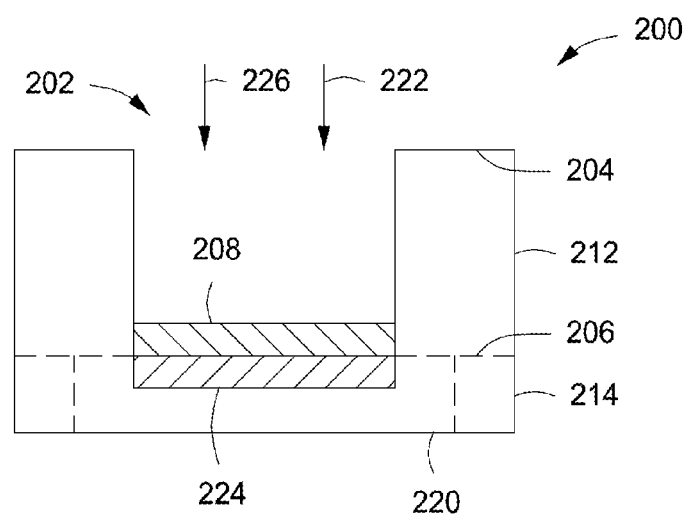
Figure 2F:
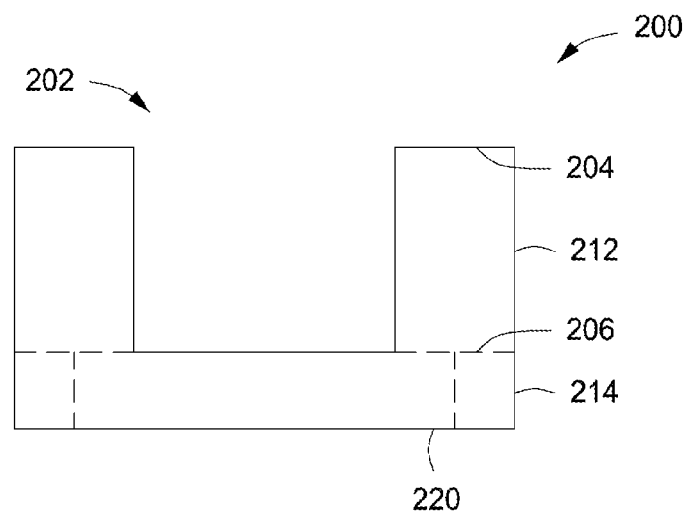

In some embodiments as depicted in FIGS. 2D-2F, in addition to the contaminated surface 224 discussed above, forming the opening 202 results in the formation of a contaminant layer 208 comprising etching related elements, such as oxygen, fluorine, and carbon, atop the conductive material 220. In such embodiments, the method 400 further comprises providing hydrogen radicals to the processing volume of the process chamber to etch the contaminant layer 208 and allow the process gas 222 to react with the contaminated surface 224 as described above. In some embodiments, the substrate 200 is exposed to the hydrogen radicals prior to removing the contaminant layer 208 and then exposed to the process gas 222 as described in method 400 above. In some embodiments, as depicted in FIG. 2E, the hydrogen radicals 226 are provided to the processing volume concurrent with exposing the substrate 200 to the process gas 222. As the hydrogen radicals 226 etch the contaminant layer 208, the process gas 222 reduces the contaminated surface 224 in the manner described above in method 400 until the conductive material 220 is free from the contaminant layer 208 and the contaminant material 208 as depicted in FIG. 2F.

Following the method 400, the substrate 200 may undergo additional processes to complete the formation of an interconnect such as a deposition process (e.g. deposition of a barrier layer, a seed layer, and a conductive fill material) and an etching/cleaning process (e.g. CMP)

Figure 3:
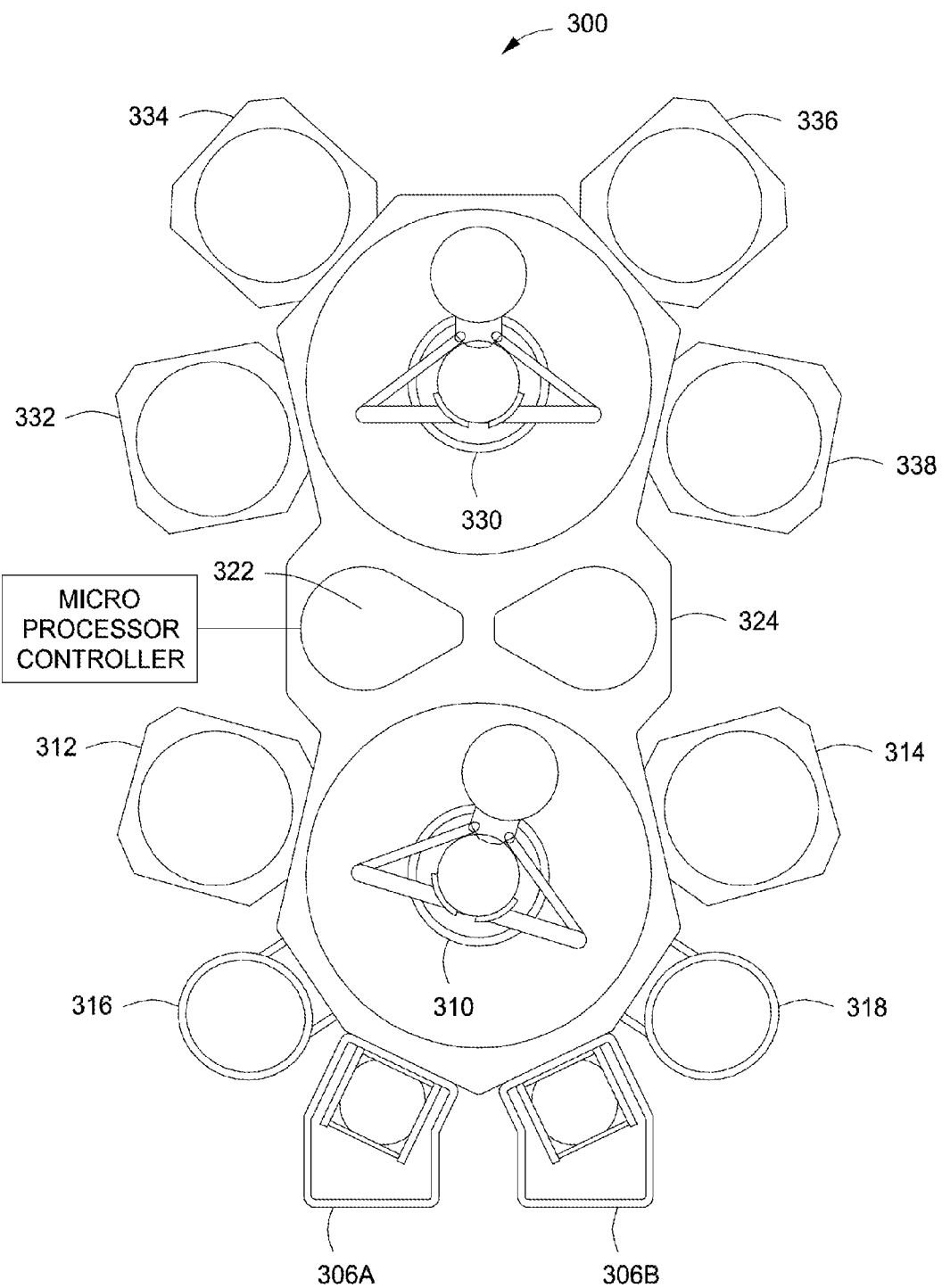
FIG. 3 depicts a cluster tool suitable to perform methods for processing a substrate in accordance with some embodiments of the present disclosure.

The methods described herein may be performed in individual process chambers that may be provided in a standalone configuration, such as process chamber 72 described with respect to FIG. 1, or as part of one or more cluster tools, for example, an integrated tool 300 (i.e., cluster tool) described below with respect to FIG. 3. In some embodiments, the method 400 of processing a substrate described above may be performed in individual process chambers (e.g., process chamber 72) provided as a standalone chamber or as part of a cluster tool.

Examples of the integrated tool 300 include the CENTURA® and ENDURA® integrated tools, available from Applied Materials, Inc., of Santa Clara, Calif. However, the methods described herein may be practiced using other cluster tools having suitable process chambers coupled thereto, or in other suitable process chambers. For example, in some embodiments the inventive methods discussed above may advantageously be performed in an integrated tool such that there are limited or no vacuum breaks between processing steps.

The integrated tool 300 can include one or more load lock chambers 306A, 306B for transferring of substrates into and out of the integrated tool 300. Typically, since the integrated tool 300 is under vacuum, the load lock chambers 306A, 306B may "pump down" the substrates introduced into the integrated tool 300. A first robot 310 may transfer the substrates between the load lock chambers 306A, 306B, and a first set of one or more substrate processing chambers 312, 314, 316, 318 (four are shown). Each substrate processing chamber 312, 314, 316, 318, can be outfitted to perform a number of substrate processing operations including the method 400 described above in addition to, physical vapor deposition processes (PVD), atomic layer deposition (ALD), chemical vapor deposition (CVD), pre-clean, thermal process/degas, orientation and other substrate processes.

The first robot 310 can also transfer substrates to/from one or more intermediate transfer chambers 322, 324. The intermediate transfer chambers 322, 324 can be used to maintain ultrahigh vacuum conditions while allowing substrates to be transferred within the integrated tool 300. A second robot 330 can transfer the substrates between the intermediate transfer chambers 322, 324 and a second set of one or more substrate processing chambers 332, 334, 336, 338. Similar to substrate processing chambers 312, 314, 316, 318, the substrate processing chambers 332, 334, 336, 338 can be outfitted to perform a variety of substrate processing operations including the physical vapor deposition processes described herein in addition to atomic layer deposition (ALD), chemical vapor deposition (CVD), pre-clean, thermal process/degas, and orientation, for example. Any of the substrate processing chambers 312, 314, 316, 318, 332, 334, 336, 338 may be removed from the integrated tool 300 if not necessary for a particular process to be performed by the integrated tool 300.

FIG. 1 depicts a substrate processing system in accordance with some embodiments of the present disclosure. For example, in some embodiments, the substrate processing system may be a pre-clean chamber, such as a Preclean II chamber available from Applied Materials, Inc., of Santa Clara, Calif. Other process chambers may also be modified in accordance with the teachings provided herein. Generally, a substrate processing system (i.e., system 40) comprises a process chamber 72 having a first volume 73 and a second volume 75. The first volume 73 may include a portion of the process chamber 72 where a plasma 77 is to be received (e.g., introduced or formed). The second volume 75 may include a portion of the process chamber 72 where a substrate is to be processed with reactants from the plasma 77. For example, a substrate support 42 may be disposed within the second volume 75 of the process chamber 72. A plasma filter 89 may be disposed in the process chamber 72 between the first volume 73 and the second volume 75 such that the plasma 77 formed in the first volume 73 (or reactants formed from the plasma 77) can only reach the second volume 75 by passing through the plasma filter 89.

The system 40 may include a gas inlet 76 coupled to the process chamber to provide one or more processes gases that may be utilized to form a plasma 77 in the first volume. A gas exhaust 78 may be coupled to the process chamber 72, for example in a lower portion of the process chamber 72 including the second volume 75. In some embodiments, an RF power source 74 may be coupled to an inductive coil 98 to generate the plasma 77 within the process chamber 72. Alternatively, (not shown), the plasma may be generated remotely, for example, by a remote plasma source or the like, and flowed into the first volume 73 of the process chamber. In some embodiment, a power source 80 may be coupled to the substrate support 42 to control ion flux to a substrate 54 when present on a surface of the substrate support 42. The system 40 may include a controller 110, for example, to control one or more components of the system 40 to perform operations on the substrate 54. Other and further components and system 40 are discussed below.

The process chamber 72 includes walls 82, a bottom 84 and a top 86. A dielectric lid 88 may be disposed under the top 86 and above a process kit 90, the process kit 90 coupled to the process chamber 72 and configured to hold the plasma filter 89. The dielectric lid 88 may be dome-shaped as illustrated in FIG. 1. The dielectric lid 88 be made from dielectric materials such as glass or quartz, and is typically a replaceable part that may be replaced after a certain number of substrates have been processed in the system 40. The inductive coil 98 may be disposed about the dielectric lid 88 and coupled to an RF power source 74 to inductively couple RF power to the first volume 73 to form the plasma 77 in the first volume 73. Alternatively to or in combination with the inductive coil 98, a remote plasma source (not shown) may be used to form the plasma 77 in the first volume 73 or to provide the plasma 77 to the first volume 73.

The process kit 90 may include a ring 91, such as a flange, having a first outer edge 93 configured to rest on the wall 82 of the process chamber 72. For example, as shown in FIG. 1, the ring 91 may rest on the wall 82 and have the dielectric lid 88 and the top 86. However, the embodiments illustrated in FIG. 1 are merely exemplary, and other embodiments are possible. For example, the ring may be configured to rest on an internal feature of the chamber (not shown), such as a lip extending inward from the wall 82 or the like. The ring 91 may further include a first inner edge 95.

The process kit 90 may include a body 97 extending downward from the first inner edge 95 of the ring 91. The body 97 may include sidewalls 99 which define an opening 100 above the substrate support 42. For example, as illustrated in FIG. 1, the diameter of the opening 100 may exceed the diameter of the substrate support 42. For example, a gap 102 formed between the substrate support 42 and the sidewalls 99 of the body 97 may be utilized as a flow path for process gases, byproducts, and other materials to be exhausted to the gas exhaust 78.

The process kit 90 may include a lip 104 extending from the sidewalls 99 of the body 97 into the opening 100 above the substrate support 42. The lip 104 may be configured to hold the plasma filter 89 as discussed below. The lip 104 may extend from the sidewalls 99 of the body 97, for example, such as from a position along the sidewalls 99 below the ring 91 as illustrated in FIG. 1. Alternatively, the lip 104 may extend from the body 97 proximate the position of the ring 91, such at a level about even with the ring 91. The lip 104 may extend from the body 97 at any suitable position, such that the plasma filter 89 may be below the plane of the induction coil 98 to prevent interference with the inductive coupling, and to prevent any stray plasma from being generated below the plasma filter 89.

The lip 104 may have a second inner edge 106 configured to support a peripheral edge of the plasma filter 89 on the second inner edge 106. For example, the second inner edge 106 may include a recess 108 disposed about the second inner edge 106 to hold the plasma filter 89 in the recess 108. However, the recess 108 is merely one exemplary embodiment for holding the plasma filter 89 and other suitable retaining mechanisms may be utilized.

The process kit 90 may comprise any suitable materials compatible with processes being run in the system 40. The components of the process kit 90 may contribute to defining the first volume 73 and second volume 75. For example, the first volume 73 may be defined by at least the ring 91, the lip 104, the plasma filter 89, and the dielectric lid 88. For example, in some embodiments, such as illustrated in FIG. 1, the first volume 73 may be further defined by the sidewalls 99 of the body 97. For example, the second volume 75 may be defined by the lip 104, the plasma filter 89, the body 97, and the substrate support 42.

The plasma filter 89 may be used to limit the ion current of the plasma 77 after the plasma 77 is formed in the process chamber. The plasma filter 89 comprises a plurality of openings 87 disposed through the plasma filter 89 from a first volume facing surface 83 of the plasma filter 89 to a second volume facing surface 85 of the plasma filter 89. The plurality of openings 87 fluidly couple the first volume 73 to the second volume 75.

Returning to the system 40, the gas inlet 76 is connected to a processing gas supply 92 and introduces a processing gas into the system 40 during processing. As illustrated, the gas inlet 76 is coupled to the first volume 73 via the dielectric lid 88. However, the gas inlet 76 may be coupled into the first volume 73 at any suitable location. The gas exhaust 78 may comprises a servo control throttle valve 94 and a vacuum pump 96. The vacuum pump 96 evacuates the system 40 prior to processing. During processing, the vacuum pump 96 and the servo control throttle valve 94 maintain the predetermined pressure within the system 40 during processing. In some embodiments, the process gas introduce by processing gas supply 92 may comprise one or more of a hydrogen containing gas suitable for forming hydrogen radicals, such as hydrogen ($H_2$), and a noble gas, such as argon (Ar) or helium (He). In some embodiments, the process gas comprises a mixture of $H_2$ and He, wherein $H_2$ is about 5%.

The process chamber 72 is further coupled to an ampoule 79 suitable for holding liquid alcohol. As described above, the ampoule 79 is maintained at a predetermined temperature, for example a temperature of about 20 to about 50 degrees Celsius to ensure the vapor pressure of the alcohol remains substantially constant. The vaporized alcohol is provided to the second volume 75 via a gas inlet 81.

The substrate support 42 generally includes one or more of a heater 44, an RF electrode 46, and a chucking electrode 48. For example, the RF electrode 46 may comprise titanium and may be connected to a power source 80 to provide an RF bias during processing. The use of bias power to the RF electrode 46 may aid in plasma ignition and/or control of ion current. However, bias power from the RF electrode 46 may not be compatible with all embodiments of the system 40. Accordingly, plasma ignition may be achieved by other means in such cases. For example, at sufficiently high pressure (depending on gas type), the capacitive coupling between the inductive coil 98 and the first volume 73 can enable plasma ignition.

The substrate support 42 may include the chucking electrode 48 to secure the substrate 54 when disposed on the substrate support to the surface of the substrate support 42. The chucking electrode 48 may be coupled to a chucking power source 50 through a matching network (not shown). The chucking power sources 50 may be capable of producing up to 12,000 W at a frequency of about 2 MHz, or about 13.56 MHz, or about 60 Mhz. In some embodiments, the chucking power source 50 may provide either continuous or pulsed power. In some embodiments, the chucking power source may be a DC or pulsed DC source.

The substrate support may include the heater 44 to heat the substrate 54 when disposed on the substrate support 42 to a predetermined temperature. The heater 44 may be any type of heater suitable to provide control over the substrate temperature. For example, the heater 44 may be a resistive heater. In such embodiments, the heater 44 may be coupled to a power source 52 configured to provide the heater 44 with power to facilitate heating the heater 44. In some embodiments, the heater 44 may be disposed above or proximate to the surface of the substrate support 42. Alternatively, or in combination, in some embodiments, the heaters may be embedded within the substrate support 42. The number and arrangement of the heater 44 may be varied to provide additional control over the temperature of the substrate 54. For example, in embodiments where more than one heater is utilized, the heaters may be arranged in a plurality of zones to facilitate control over the temperature across the substrate 54, thus providing increased temperature control.

The controller 110 comprises a central processing unit (CPU) 112, a memory 114, and support circuits 116 for the CPU 112 and facilitates control of the components of the system 40 and, as such, methods of processing a substrate in the system 40. The controller 110 may be any form of general-purpose computer processor that can be used in an industrial setting for controlling various chambers and sub-processors. The memory, or computer-readable medium, 114 of the CPU 112 may be one or more of readily available memory such as random access memory (RAM), read only memory (ROM), floppy disk, hard disk, or any other form of digital storage, local or remote. The support circuits 116 are coupled to the CPU 112 for supporting the processor in a conventional manner. These circuits include cache, power supplies, clock circuits, input/output circuitry and subsystems, and the like. The memory 114 stores software (source or object code) that may be executed or invoked to control the operation of the system 40 in the manner described herein. The software routine may also be stored and/or executed by a second CPU (not shown) that is remotely located from the hardware being controlled by the CPU 112.

In an example of operation, the substrate 54 is positioned on the substrate support 42, and the second volume 75 is pressurized to about 0.1 to about 30 Torr, or about 0.6 to about 3 Torr. An alcohol processing gas, such as ethanol, is drawn through the gas inlet 81 into the second volume 75 due to the pressure difference between the second volume 75 and the ampoule 79. To activate the reaction, the substrate 54 is heated to a temperature of about 250 to about 350 degrees Celsius. The substrate is exposed to the ethanol for about 30 to about 120 seconds to reduce the contaminated surface 224 of the conductive material 220. In some embodiments, a processing gas such as hydrogen ($H_2$) is introduced through the gas inlet 76 into the first volume 73. Hydrogen radicals from a plasma formed from the hydrogen gas are generated in the processing region through inductive coupling and/or capacitive coupling. The plasma 77 may be generated by applying suitable power to the inductive coil 98. As described above, the hydrogen radicals remove contaminant layer 208 and the vaporized alcohol reduces the contaminated surface 224 resulting in a conductive material 220 maintaining low-k integrity, electrical conductivity and reliability for IC interconnect structures.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure.

While the foregoing is directed to embodiments of the present disclosure, other and further embodiments of the disclosure may be devised without departing from the basic scope thereof.

The invention claimed is:

1. A method of processing a substrate, comprising:
heating a substrate disposed within a processing volume of a substrate processing chamber to a temperature of up to about 400 degrees Celsius, wherein the substrate comprises a first surface, an opposing second surface, and an opening formed in the first surface and extending towards the opposing second surface, and wherein the second surface comprises a conductive material disposed in the second surface and aligned with the opening;
heating an ampoule to a predetermined temperature to vaporize a liquid alcohol, wherein the ampoule is disposed exterior to the processing chamber;
introducing the vaporized alcohol into the processing chamber; and
exposing the substrate to substantially a process gas comprising about 80 to about 100 wt % of the vaporized alcohol to reduce a contaminated surface of the conductive material.

2. The method of claim 1, wherein the conductive material is copper or cobalt.

3. The method of claim 1, wherein the alcohol has a formula $C_nH_{2n+1}$—OH, wherein n is a whole number.

4. The method of claim 1, wherein a pressure of the substrate processing chamber while exposing the substrate to the process gas is about 0.1 to about 30 Torr.

5. The method of claim 1, wherein a pressure of the substrate processing chamber while exposing the substrate to the process gas is about 0.6 to about 3 Torr.

6. The method of claim 1, further comprising exposing the substrate to the process gas for up to about 60 seconds.

7. The method of claim 1, wherein the predetermined temperature is about 20 to about 50 degrees Celsius, and wherein a vapor pressure of the alcohol within the ampoule is substantially constant.

8. The method of claim 1, further comprising drawing the vaporized alcohol from the ampoule into the processing volume via a vacuum draw process.

9. The method of claim 1, further comprising exposing the substrate to hydrogen radicals provided to the processing volume from a remote plasma source coupled to the substrate processing chamber.

10. The method of claim 3, wherein the alcohol is one or more of ethanol, isopropanol, methanol, or butanol.

11. The method of claim 9, wherein the hydrogen radicals are provided to the processing volume at least one of prior to or concurrently with exposing the substrate to the process gas.

12. A method of processing a substrate, comprising:
heating a substrate disposed in a processing volume of a substrate processing chamber to a temperature of up to about 400 degrees Celsius, wherein the substrate comprises a first surface and an opening formed in the first surface and extending towards an opposing second surface having a copper material disposed in the second surface and aligned with the opening;
heating an ampoule to a predetermined temperature to vaporize a liquid alcohol, wherein the ampoule is disposed exterior to the processing chamber;
introducing the vaporized alcohol into the processing chamber; and
exposing the substrate to substantially a process gas comprising about 80 to about 100 wt % of the vaporized alcohol to reduce a contaminated surface of the copper material, wherein the alcohol has a formula $C_nH_{2n+1}$—OH, and wherein n is a whole number.

13. The method of claim 12, further comprising:
exposing the substrate to hydrogen radicals provided to the processing volume from a remote plasma source coupled to the substrate processing chamber.

14. The method of claim 12, further comprising exposing the substrate to the alcohol for up to about 60 seconds.

15. The method of claim 12, wherein the predetermined temperature is about 20 to about 50 degrees Celsius, and wherein a vapor pressure of the alcohol within the ampoule is substantially constant.

16. The method of claim 12, further comprising drawing the vaporized alcohol from the ampoule into the processing volume via a vacuum draw process.

17. The method of claim 13, wherein the hydrogen radicals are provided to the processing volume at least one of prior to or concurrently with exposing the substrate to the alcohol.

18. A method of processing a substrate, comprising:
heating a substrate disposed within a processing volume of a substrate processing chamber to a temperature of up to about 400 degrees Celsius, wherein the substrate comprises a first surface, an opposing second surface, and an opening formed in the first surface and extending towards the opposing second surface, and wherein the second surface comprises a conductive material disposed in the second surface and aligned with the opening;
exposing the substrate to a process gas comprising about 80 to about 100 wt % of an alcohol to reduce a contaminated surface of the conductive material; and
exposing the substrate to hydrogen radicals provided to the processing volume from a remote plasma source coupled to the substrate processing chamber, wherein the hydrogen radicals are provided to the processing volume at least one of prior to or concurrently with exposing the substrate to the process gas.

\* \* \* \* \*